(12) United States Patent
Pearson et al.

(10) Patent No.: US 6,376,096 B1
(45) Date of Patent: Apr. 23, 2002

(54) NANOCHANNEL GLASS REPLICA MEMBRANES

(75) Inventors: Douglas H. Pearson, Laurel; Ronald J. Tonucci, Waldorf, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/398,946

(22) Filed: Aug. 24, 1999

Related U.S. Application Data

(62) Division of application No. 08/725,213, filed on Sep. 24, 1996, now Pat. No. 5,976,444.

(51) Int. Cl.⁷ .................................................. B32B 3/10
(52) U.S. Cl. ........................ 428/596; 428/131; 428/137; 428/304.4; 428/315.5; 428/315.9; 428/613; 428/615
(58) Field of Search ................................. 428/596, 131, 428/137, 304.4, 315.5, 315.9, 613, 615

(56) References Cited

U.S. PATENT DOCUMENTS

| 4,656,358 A | * | 4/1987 | Divens et al. ............... 250/372 |
| 5,234,594 A | * | 8/1993 | Tonucci et al. ........ 210/500.26 |
| 5,266,391 A | * | 11/1993 | Donato et al. .............. 428/220 |
| 5,843,767 A | * | 12/1998 | Beattie ..................... 435/287.1 |
| 6,045,677 A | * | 4/2000 | Beetz, Jr. et al. ............. 205/50 |

* cited by examiner

*Primary Examiner*—Suzanne E. McDowell
(74) *Attorney, Agent, or Firm*—John J. Karasek; Jane Barrow

(57) ABSTRACT

The present invention is a process for making a nanochannel glass (NCG) replica, having the steps of: coating a face of an etched NCG with a replica material (with or without an intervening buffer layer), where the etched NCG face has a plurality of channels arranged in a desired pattern, to form a replica coating on the NCG conforming to the pattern; and removing the replica coating from the etched NCG. The present invention is also the replica made by this process.

17 Claims, 3 Drawing Sheets

NANOCHANNEL GLASS REPLICA MEMBRANES

CROSS-REFERENCE TO RELATED APPLICATION

This is a divisional of application Ser. No. 08/725,213 filed on Sep. 24, 1996 now U.S. Pat. No. 5,976,444.

BACKGROUND OF THE INVENTION

1. Field of the Invention

The present invention relates to methods for making structures that mimic the patterns in nanochannel glasses.

2. Description of the Related Art

In complex structures, the relative placement of features is an important concern, along with the size and resolution of the features. It is a continuing goal in miniaturization efforts (e.g., electronics) to make structures, including freestanding (i.e., structures not disposed on a supporting substrate) structures, with nanoscale features (e.g., $\geq 10^8$, $10^9$, $10^{10}$, $10^{11}$, etc. features/cm$^2$). It is particularly desired to make these structures of various materials that can be used as masks for a variety of parallel processing techniques. Masks made from etched NCG have been used in these processes. However, for feature sizes smaller than 1 μm, the aspect ratio of the etched NCG increases rapidly. For instance, the lowest aspect ratio obtained to date in an etched NCG mask for a 1 μm feature size has been about 4:1 (thickness/feature width). Desirable masks will have controllable aspect ratios.

As used herein, nanochannel glass (NCG) refers to a composite of different glasses, where these glasses are arranged in selected nanoscale patterns. Typically, NCG will be a composite of two glasses, referred to as the "matrix glass" and the "etchable glass". Upon exposure to some agent(s) or condition(s), the etchable glass will dissolve or otherwise be removed from the matrix glass, and the matrix glass will be unaffected, or at least minimally affected by these conditions. Such conditions include, but are not limited to, exposure to a solvent such as an acid, a base, reactive ions, or water. "Etched NCG" refers to the NCG that has been at least partially (and optionally completely) developed by exposure to an agent or condition that will differentially remove glass from the NCG, and "channel" refers to the voids created by this removal of glass, regardless of the geometry of these voids. It is this property of having the different glasses arranged in selected patterns, with high accuracy (ca. 0.5% of channel size), high precision (high repeatability), and small, controllable minimum feature sizes (ca. 10 nm or less), that distinguishes NCG from other composite glasses. Likewise, it is the property of having voids arranged in selected patterns that distinguishes etched NCG from other porous glasses (such as Vycor™).

Currently, conventional high resolution lithographic masks with small feature sizes are made by serial e-beam lithography, or (more recently) by AFM/STM patterning. These require a large number of processing steps, as well as a pixel-by-pixel exposure of the mask.

In particular, it is desired to provide masks for making structures with regular arrays of features, such as quantum electronic devices, magnetic storage media, and nonlinear opto-electronic devices.

For these types of devices with nanoscale features, a continuing obstacle is the inability to combine fine nanoscale features, high packing densities (e.g., $\geq 10^9$ features/cm$^2$), and large expanses (e.g., an entire wafer). For instance, in the aforementioned serial e-beam lithography, as the e-beam writing process progresses, there is a tendency for the beam to deviate (or lose global registration) from its intended or programmed location, due to positioning instabilities. This effect can be somewhat mitigated by the use of fiducials, but the problem is inherent to e-beam lithography. In addition to the problem of global registration, long write times are required to write a large number of features. Thus, even if one was willing to go to the (probably prohibitive) expense of trying to expose a large wafer (e.g., a 6" wafer) with a large number of nanoscale features, one would likely find the technical problems insurmountable at present.

SUMMARY OF THE INVENTION

Accordingly, it is an object of this invention to provide structures with nanoscale features (voids), which may or may not be freestanding.

It is a further object of this invention to provide an inexpensive method for making such structures.

It is a further object of this invention to make these structures with controlled aspect ratios, including low aspect ratios.

It is a further object of the invention to make these structures with larger overall areas, higher packing densities, and greater numbers of features than are currently available through other methods, such as e-beam lithography.

These and additional objects of the invention are accomplished by the structures and processes hereinafter described.

The present invention is a process for making a nanochannel glass (NCG) replica, having the steps of: coating a face of an etched NCG with a replica material (with or without an intervening buffer layer), where the etched NCG face has a plurality of channels arranged in a desired pattern, to form a replica coating on the NCG conforming to the pattern; and removing the replica coating from the etched NCG. The present invention is also the replica made by this process.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Nanochannel glasses with preselected patterns will be made following techniques previously taught by the inventors. The following are incorporated by reference herein, in their entireties, for all purposes:

(a) U.S. Pat. No. 5,332,681, issued Jul. 26, 1994 to Tonucci et al. [Tonucci '681];

(b) U.S. Pat. No. 5,264,722, issued Nov. 23, 1993 to Tonucci et al. [Tonucci '722];

(c) U.S. Pat. No. 5,306,661, issued Apr. 26, 1994 to Tonucci et al. [Tonucci '661];

(d) Tonucci et al., "Nanochannel Array Glass", *Science* 258 783–85 (Oct. 30, 1992);

(e) Pearson et al., "Nanochannel Glass Replica Membranes", *Science* 270 68–70 (Oct. 6, 1995);

(f) U.S. patent application Ser. No. 08/725, filed on date even herewith for "PARALLEL CONTACT PATTERNING USING NANOCHANNEL GLASS", and issuing on Jan. 5, 1999, having U.S. Pat. No. 5,855,716.

Figure 1:
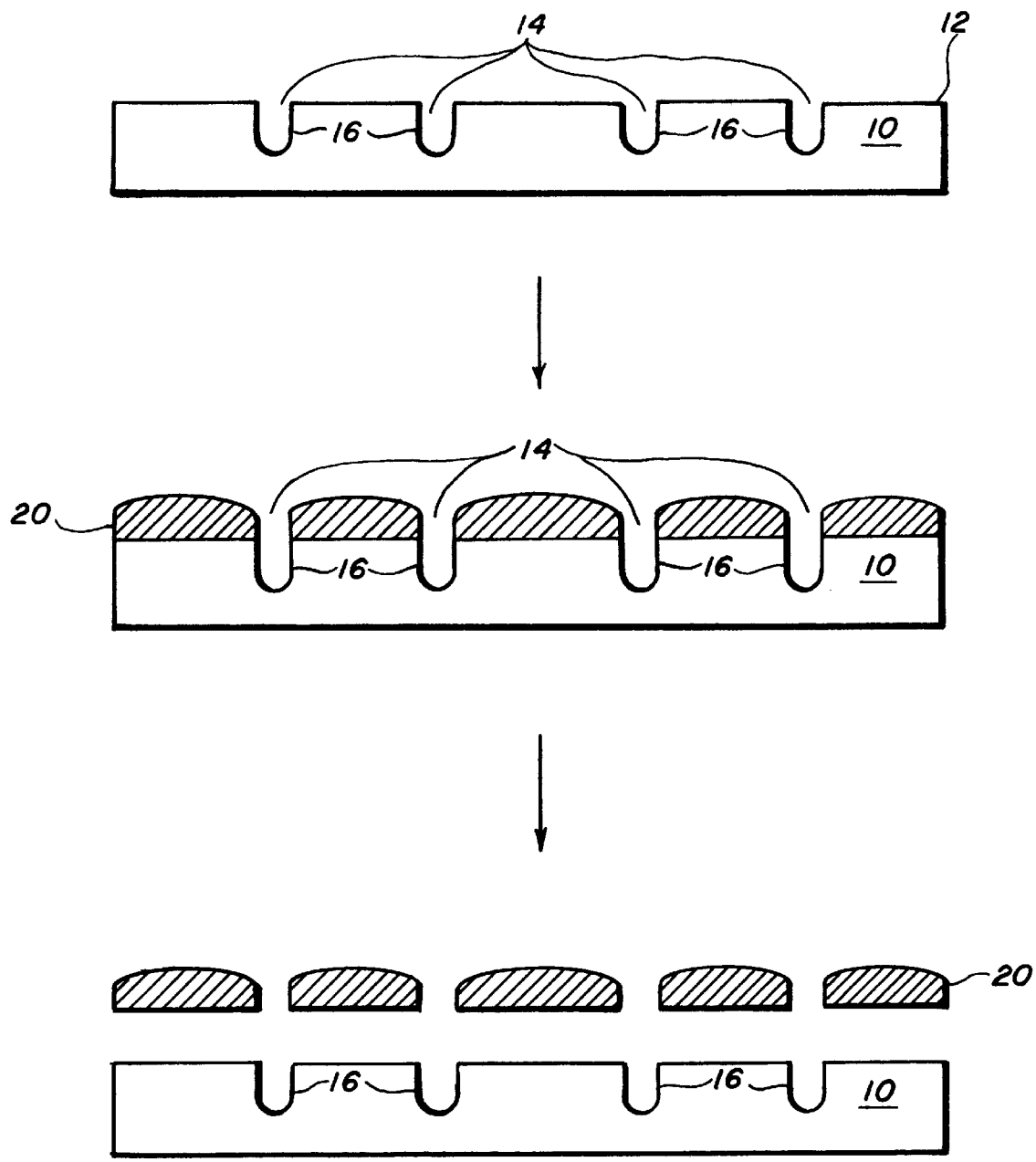
FIG. 1 shows the sequence of steps to the invention in block diagram form.

Referring to FIG. 1, the invention is preferably practiced as follows. A sample of etched NCG 10 is prepared so that a face 12 of the etched NCG 10 has a pattern 14 of channels 16 corresponding to the pattern desired for the replica. Typically, the pattern-bearing face of the NCG is polished to a high degree of flatness, using available glass polishing techniques. Alternatively, for a curved (concave or convex) replica, the pattern-bearing face of the NCG is polished to fit (convex or concave) this curved replica. As used herein, "convex" and "concave" indicate the sign of the curvature, and are not limited to particular geometries. Typically, the polishing step is performed before the channels in the NCG are developed (i.e., before the etchable glass is removed).

Very large NCGs with very large area patterns are made by iterating the basic process for making NCGs, as described in the references supra.

A replica material 20 is applied to the pattern-bearing face 12 of the etched NCG 10, so that this applied material carries the same pattern as the pattern-bearing face of the etched NCG (i.e., the etched NCG face acts as a master for the applied material). A variety of techniques may be used to deposit the materials to be applied to the etched NCG. These include line-of-sight (LOS) deposition techniques such as thermal evaporation, electron beam evaporation, molecular beam epitaxy, and laser ablation, nearly LOS techniques such as sputtering at low pressure, and (in some instances) non-LOS techniques such as chemical vapor deposition (CVD) and sputtering at high pressure. Practitioners will choose between these techniques for depositing metals (hard ferromagnetic, soft ferromagnetic, antiferromagnetic, non-ferromagnetic), semimetals, semiconductors, insulators, superconductors, organics (including polymers), etc.

The distinguishing factor between LOS and non-LOS deposition techniques in this context relates to the trajectories of the deposited atoms. In LOS techniques, the depositions usually take place at pressures of $10^{-5}$ torr and below, and the deposited atoms travel undeflected away from the source to the substrate in straight lines. In nearly LOS techniques, such as sputtering at low pressures, the deposited atoms suffer collisions with gas molecules and other atoms between the source and the substrate, slightly reducing the directionality of the deposited atoms compared to LOS techniques.

In non-LOS techniques, such as sputtering at high pressures and chemical vapor deposition, the deposited atoms arrive at the substrate with minimal directionality, coating all outer surfaces essentially uniformly.

Aspect ratios may be controlled by controlling the deposition of the replica material, and the size of the voids in the etched NCG. For many patterning applications aspect ratios of less than 1.0, e.g., 0.5, 0.1, 0.05, etc., are desired. For other applications higher aspect ratios may be desired, e.g., 5, 10, 50, 100, and greater.

It has been demonstrated that a wide range of metal replica materials including platinum, palladium, gold, molybdenum, and tungsten can be deposited on an etched NCG face and subsequently be removed intact to form an NCG replica. Since Mo and W are considered to be the most difficult metals to make into an NCG replica according to the present invention, and since making NCG replicas with each of these metals has been demonstrated, the invention is considered to be practicable with any of the transition metals, as well as other metals. In principal, any solid material which can be deposited by methods such as those described above is amenable to the inventions, particularly if a suitable buffer layer is available.

Ordered, disordered, and amorphous metal alloys, composites, and multilayers are all available as replica materials in the present invention. Alloys may be made by co-deposition, or by deposition from an alloy source. Composites may be made by annealing alloy replicas after removal from the etched NCG. Multilayer replicas may be made by sequential deposition. Such multilayers will have a variety of applications. For example, metals (bard ferromagnetic, soft ferromagnetic, antiferromagnetic, non-ferromagnetic), semimetals, semiconductors, insulators, superconductors, organics (including polymers), etc., could be sequentially deposited to make complex layered structures. Likewise, a sequence of layers could be deposited to provide optimized surface and bulk effects. As an example, a thin Ti layer, a thicker Pt layer, and another thin Ti layer have been deposited to provide a structure with good chemical resistance (from the Ti), and good mechanical properties, e.g., ductility (from the Pt). It may be desirable to control the properties of the interface between adjacent metal layers by controlling the transition from one layer to the next, e.g., by forming a selected thin alloy interlayer between adjacent layers.

Figure 1A:
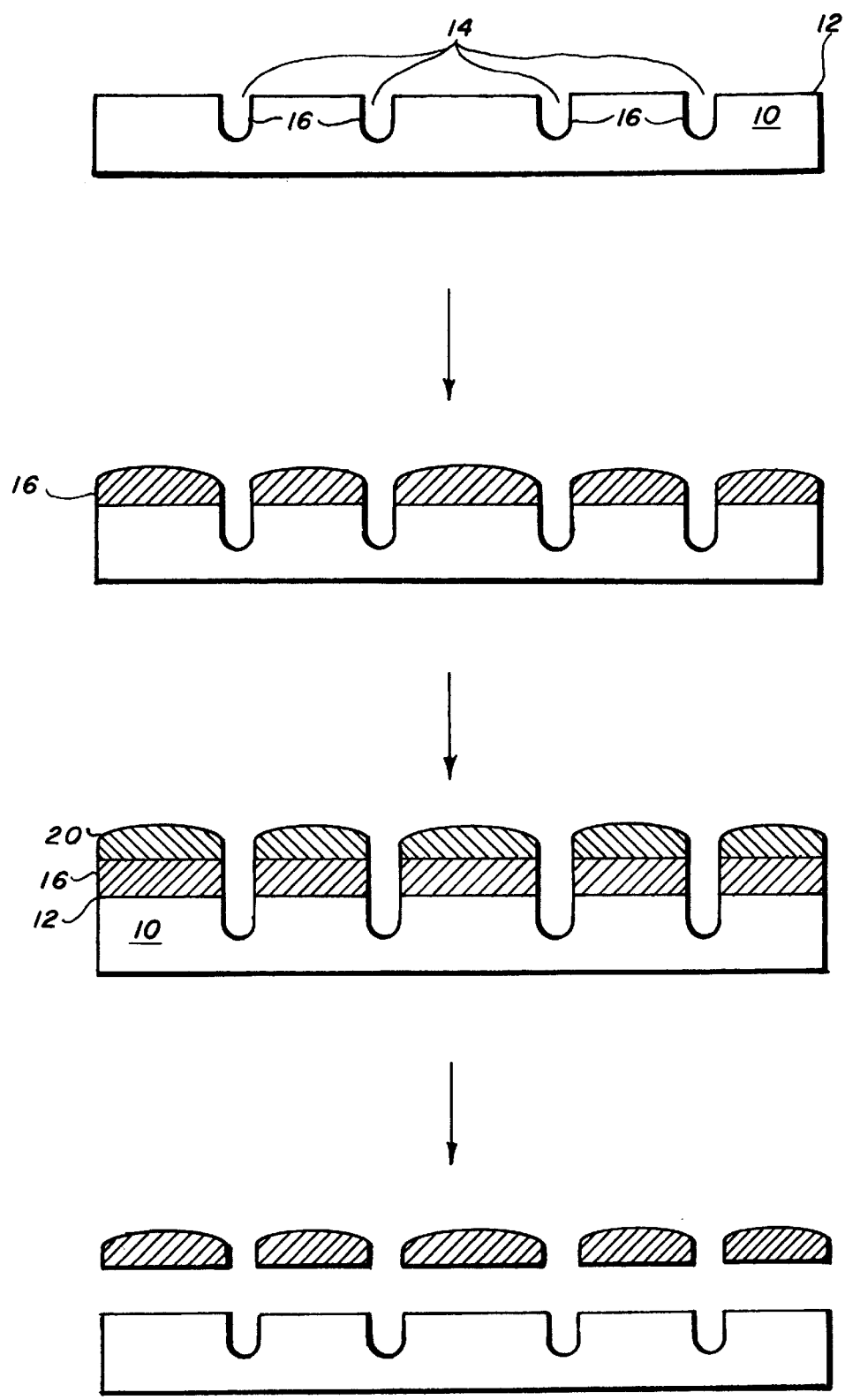
FIG. 1a shows the sequence of steps to the invention in block diagram form, where this process includes using an optional buffer layer.

Optionally, as shown in FIG. 1a, a buffer material 18 may be deposited in a layer between the pattern-bearing face 12 of the etched NCG 10 and the applied material 20. Such buffer layers 18 typically will be used to facilitate the removal of the etched NCG 10 from the applied material 20. Aluminum is the preferred buffer layer for most replica metals, except for aluminum itself. Copper is the preferred buffer layer for aluminum replicas. Metal buffer layers can be removed easily with acid solutions or base solutions.

Suitable buffer layer materials include semiconductors, insulators, ceramics, metals such as aluminum, alloys that are soluble in acids or bases, polymers that are soluble in organic solvents, and various water soluble materials such as sodium metaphosphate, other salts, and hygroscopic glasses. Sodium metaphosphate, for example, is a highly effective buffer layer. Besides being water soluble, it has a number of advantages, including that it can be evaporated, and that it is typically amorphous when evaporated (and therefore there is not the problem of grain growth interfering with the sharpness of the buffer layer). Other water soluble buffer layer materials are sodium chloride, and other salts.

Buffer layers may deposited by any suitable LOS method, and also by nearly LOS and non-LOS methods, such as chemical vapor deposition (CVD) and wet chemistry.

Figure 2:
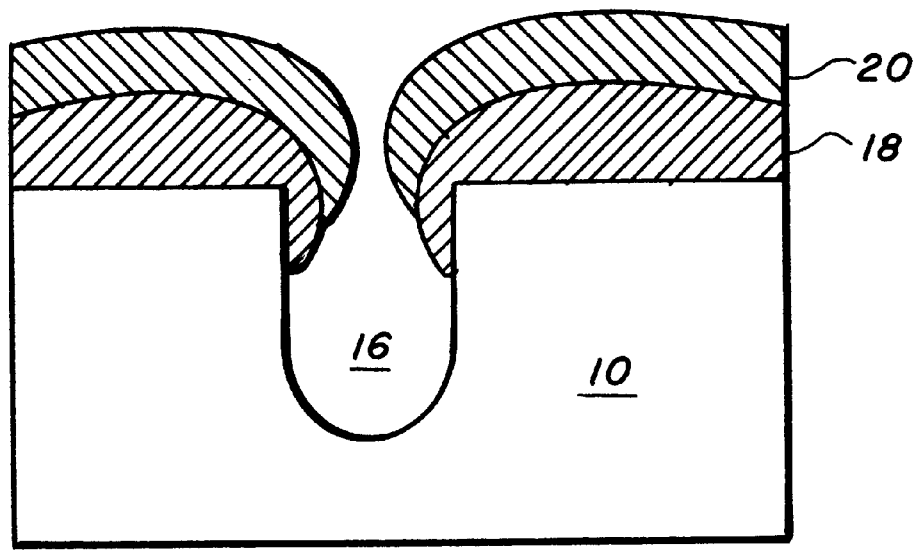
FIG. 2 shows a replica material partially endcapped over a buffer layer according to the invention.
Figure 3:
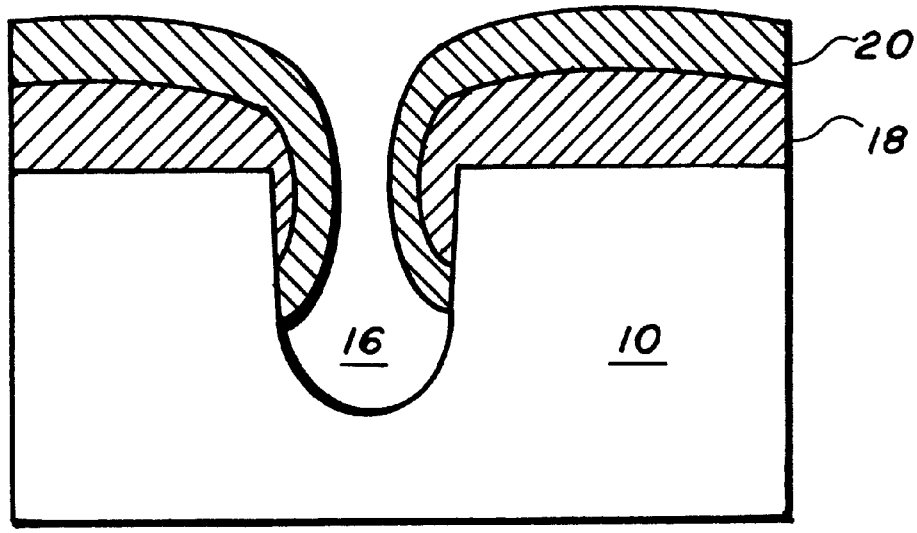
FIG. 3 shows a replica material fully endcapped over a buffer layer.

As seen in FIG. 2, partial endcapping (or pinch-off) of the replica material 20 over the optional buffer layer 18 and the etched NCG 10, can advantageously provide replicas with smaller apertures than the channels 16 in the etched NCG 10. However, as seen in FIG. 3, care should be taken so that this pinch-off effect does not result in the replica material 20 completely endcapping the buffer layer 18, so that the buffer will be inaccessible to solvents and therefore will not provide liftoff.

After the replica material is coated onto the etched NCG (with or without the intervening buffer layer), the applied material is removed from the etched NCG, with the pattern thereon intact, thereby forming the NCG replica. Depending on the particular applied material, and the manner in which it is applied, the method of removing the material to the pattern-bearing face of the NCG will vary. For example, if a soluble buffer layer is interposed between the applied material and the etched NCG, the coated etched NCG may be contacted with a solvent for dissolving the buffer layer, thereby allowing the intact replica to be removed from the etched NCG.

Alternatively, the coated etched NCG is placed in contact with a solvent that is selected to (a) dissolve the etched NCG, and (b) not damage the applied material.

Alternatively, replica materials and NCGs may have differential coefficients of thermal expansion, which may be exploited (by heating or cooling) to remove the replica from the NCG.

NCG replica membranes according to the present invention may be freestanding, or may be supported on a variety of substrates, including (but not limited to) semiconductor (e.g., silicon), insulator, superconductor, organic (including polymer), ceramic, and metal (e.g., copper, gold, aluminum, iron, and various metal alloys) substrates.

Using the processes described herein, a person of ordinary skill in the art can make NCG replica membranes with exceptional minimum feature size, packing density, total number of features, and patterned areas. Moreover, exceptional combinations of these features likewise can be obtained. For example, replica membranes with patterned areas that have at least $10^4$ features, typically at least $10^7$ features, more typically at least $10^8$ features, preferably at least $10^9$ features, more preferably at least $10^{10}$ features, still more preferably at least $10^{11}$ features, or most preferably at least $10^{12}$ features therein are attainable by the present invention. It is contemplated that replica membranes with $10^{15}$ features can be made by the present invention. Likewise, replica membranes with patterned areas that are at least 1" across, typically at least 2" across, more typically at least 4" across, preferably at least 6" across, more preferably at least 8" across, or most preferably at least 12" across are attainable by the present invention. Also, replica membranes with patterned areas that have local packing densities of at least $10^8$ features/cm$^2$, typically at least $10^9$ features/cm$^2$, more typically at least $10^{10}$ features/cm$^2$, preferably at least $10^{11}$ features/cm$^2$, more preferably at least $10^{12}$ features/cm$^2$, or most preferably at least $10^{13}$ features/cm$^2$ are attainable by the present invention. Also, replica membranes with patterned areas that have global packing densities of at least $10^3$ features/cm$^2$, typically at least $10^5$ features/cm$^2$, more typically at least $10^7$ features/cm$^2$, preferably at least $10^9$ features/cm$^2$, more preferably at least $10^{11}$ features/cm$^2$, or most preferably at least $10^{13}$ features/cm$^2$ are attainable by the present invention. It is contemplated that replica membranes with packing densities of $10^{13}$ features/cm$^2$ can be made by the present invention. Furthermore, replica membranes with patterned areas that have minimum feature sizes of submicron size, below 200 nm, typically below 100 nm, preferably below 50 nm, more preferably below 20 nm, or most preferably below about 10 nm are attainable by the present invention.

Having described the invention, the following examples are given to illustrate specific applications of the invention, including the best mode now known to perform the invention. These specific examples are not intended to limit the scope of the invention described in this application.

EXAMPLE 1

Fabrication of a Replica Membrane

As an illustration of this process, a hexagonally patterned platinum replica membrane was fabricated to be 75 nm in thickness with voids 40 nm in diameter. This membrane was prepared by mechanically polishing the surface of an NCG wafer 0.9 mm in diameter using progressively smaller diamond grits to a final grit size of 0.25 $\mu$m. After polishing, the wafer was briefly acid etched, exposing the voids to a depth of approximately 1.5 $\mu$m, and was then coated with 90 nm of aluminum followed by 75 nm of platinum using planar magnetron sputtering in argon gas. The sample was then slowly immersed in a solution of 3 g sodium hydroxide in 15 ml deionized water at a temperature of 60° C., quickly dissolving the aluminum and releasing the platinum replica membrane. The membrane was rinsed in deionized water and picked up with a 1000 mesh copper grid for SEM characterization. An SEM micrograph of this membrane is shown in FIG. 3 of Pearson et al., supra. The membrane has an aspect ratio slightly less than two and in contains a packing density greater than $3 \times 10^9$ voids/cm$^2$.

The replica membrane shown in FIG. 3 of Pearson et al. was prepared from an etched NCG wafer with voids 130 nm in diameter which are considerably larger than the voids present in the membrane itself. This reduction in the void diameter is a result of the sputtering process, as noted supra.

EXAMPLE 2

Use of a Replica Membrane in Substrate Patterning

To illustrate the use of these membranes in substrate patterning, a platinum replica membrane was prepared to be 110 nm in thickness with voids 115 nm in diameter, for use as a deposition mask. The membrane was prepared from an etched NCG wafer 1.65 mm in diameter with voids 240 nm in diameter. After polishing and etching, the NCG wafer was sputter coated with 100 nm of aluminum followed by 110 nm of platinum. The membrane was released from the etched NCG wafer and rinsed, and was then placed on a silicon (110) substrate and allowed to dry.

30 nm of platinum was sputtered onto the silicon (110) substrate, through the replica membrane. The replica membrane was then removed with adhesive tape, leaving an array of platinum dots on the surface of the silicon substrate. An SEM micrograph of the silicon substrate following the patterned platinum deposition and removal of the membrane is shown in FIG. 4 of Pearson et al., supra. Similar experiments have also been carried out at larger feature sizes, resulting in the patterned deposition of tungsten, molybdenum, gold, and nickel on various substrates. It has been found that these membranes maintain their pattern integrity at the elevated temperatures which may be encountered in deposition processes. This stability is a benefit compared to conventional resists used in lithographic processes, which can suffer pattern degradation under the deposition of refractory materials.

Obviously, many modifications and variations of the present invention are possible in light of the above teachings. It is therefore to be understood that, within the scope of the appended claims, the invention may be practiced otherwise than as specifically described.

What is claimed is:

1. A replica of an etched NCG, comprising:
   a membrane,
   wherein said membrane is a replica of an etched NCG,
   wherein said membrane has at least $10^6$ voids therein,
   wherein said voids have submicron widths, and
   wherein said voids have preselected positions across a diameter of said membrane.

2. The replica of claim 1, wherein said membrane has at least $10^7$ voids therein.

3. The replica of claim 1, wherein said membrane has a patterned area that is at least 1" across.

4. The replica of claim 1, wherein said membrane has a patterned area that is at least 2" across.

5. The replica of claim 1, wherein said membrane has a local packing density of at least $10^9$ feature/cm$^2$.

6. The replica of claim 1, wherein said membrane has a local packing density of at least $10^{10}$ features/cm$^2$.

7. The replica of claim 1, wherein said membrane has a minimum feature size of below 200 nm.

8. The replica of claim 1, wherein said membrane has a minimum feature size of below 50 nm.

9. The replica of claim 1, wherein said membrane has a minimum feature size of below about 10 nm.

10. The replica of claim 1, wherein said membrane has global registration of said features.

11. The replica of claim 1, wherein said voids within said membrane have an aspect ratio of less than 1.

12. The replica of claim 1, wherein said aspect ratio is less than 0.05.

13. The replica of claim 1, wherein said aspect ratio is greater than 1.

14. The replica of claim 1, wherein said membrane substantially comprises a material selected from the group consisting of hard magnetic material soft magnetic materials, non-magnetic materials, antiferromagnetic materials, semiconductor materials, insulating materials, and superconducting materials.

15. The replica of claim 1, wherein said membrane substantially comprises a material selected from the group consisting of metals, ceramics, organics, semimetals, and glasses.

16. The replica of claim 1, wherein said membrane substantially comprises a polymer.

17. The replica of claim 1, wherein said membrane is a laminate having a plurality of layers, wherein each of said layers substantially comprises a material selected from the group consisting of hard magnetic materials, soft magnetic materials, nonmagnetic materials, antiferromagnetic materials, semiconductor materials, insulating materials, and superconducting materials.

* * * * *